(12) United States Patent
Wang et al.

(10) Patent No.: US 11,722,115 B2
(45) Date of Patent: Aug. 8, 2023

(54) RADIO FREQUENCY DUPLEXER CIRCUIT AND RADIO FREQUENCY SUBSTRATE

(71) Applicants: Beijing BOE Technology Development Co., Ltd., Beijing (CN); BOE TECHNOLOGY GROUP CO., LTD., Beijing (CN)

(72) Inventors: Xiyuan Wang, Beijing (CN); Feng Qu, Beijing (CN)

(73) Assignees: Beijing BOE Technology Development Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/514,895

(22) Filed: Oct. 29, 2021

(65) Prior Publication Data

US 2022/0311406 A1    Sep. 29, 2022

(30) Foreign Application Priority Data

Mar. 23, 2021    (CN) .......................... 202110308189.0

(51) Int. Cl.
*H03H 7/46*    (2006.01)
*H03H 7/01*    (2006.01)

(52) U.S. Cl.
CPC .......... *H03H 7/463* (2013.01); *H03H 7/0115* (2013.01); *H03H 7/175* (2013.01); *H03H 7/1775* (2013.01)

(58) Field of Classification Search
CPC ........ H03H 7/46; H03H 7/0115; H03H 7/463; H03H 7/1775; H03H 7/175
USPC ........................................................... 333/175
See application file for complete search history.

(56) References Cited

U.S. PATENT DOCUMENTS

| | | | |
|---|---|---|---|
| 6,411,178 B1* | 6/2002 | Matsumura ............ | H03H 7/175 333/185 |
| 2004/0130414 A1* | 7/2004 | Marquardt ........... | H03H 7/0161 333/175 |
| 2006/0145782 A1* | 7/2006 | Liu ........................ | H03H 7/463 333/132 |
| 2020/0275548 A1* | 8/2020 | Imayoshi ............. | H05K 3/4605 |

* cited by examiner

*Primary Examiner* — Rakesh B Patel
(74) *Attorney, Agent, or Firm* — Houtteman Law LLC

(57) ABSTRACT

The present disclosure provides a radio frequency duplexer circuit and a radio frequency substrate. The radio frequency duplexer circuit includes a first terminal, a second terminal, a third terminal, a low-pass filter, and a high-pass filter. The low-pass filter includes N first filter sub-circuits coupled in series and a first tuning sub-circuit. Among the N first filter sub-circuits coupled in series, a first end of a $1^{st}$ first filter sub-circuit is coupled to the first terminal, and a second end of a $N^{th}$ first filter sub-circuit is coupled to the second terminal. The high-pass filter includes M second filter sub-circuits coupled in series and a second tuning sub-circuit. Among the M second filter sub-circuits coupled in series, a first end of a $1^{st}$ second filter sub-circuit is coupled to the first terminal, and a second end of a $M^{th}$ second filter sub-circuit is coupled to the third terminal.

13 Claims, 2 Drawing Sheets

RADIO FREQUENCY DUPLEXER CIRCUIT AND RADIO FREQUENCY SUBSTRATE

CROSS-REFERENCE TO RELATED APPLICATIONS

The present disclosure claims the priority of Chinese Patent Application No. 202110308189.0, filed on Mar. 23, 2021, the contents of which are incorporated herein by reference in its entirety.

TECHNICAL FIELD

The present disclosure belongs to the field of communication technology, and in particular, to a radio frequency duplexer circuit and a radio frequency substrate.

BACKGROUND

Recently, the consumer electronics industry is developing day by day, mobile communication terminals represented by mobile phones, particularly 5G mobile phones, are developing rapidly, the frequency bands of signals to be processed by the mobile phones are increasing, the number of required radio frequency chips is also rising. The mobile phones popular for the consumers are developing continuously towards miniaturization, lightness, thinness and long battery life. In a traditional mobile phone, a large number of discrete devices such as resistors, capacitors, inductors, filters and the like are disposed on a radio frequency print circuit board (PCB), since the discrete devices have disadvantage such as a large volume, high power consumption, lots of welding spots, and a large change for parasitic parameters, the mobile phone is difficult to meet future requirements. The interconnection, matching and the like between the radio frequency chips require integrated passive devices with a small area, a high performance and a good consistency. The integrated passive devices currently on the market are mainly silicon (Si)-based substrates and gallium arsenide (GaAs)-based substrates. The Si-based integrated passive device has advantages such as a low cost and the like, but the Si-based integrated passive device has a high microwave loss due to trace impurities (i.e., poor insulation) inside the Si, as a result, the Si-based integrated passive device has an average performance. The GaAs-based integrated passive device has advantages such as excellent performance and the like, but the GaAs-based integrated passive device is expensive.

SUMMARY

As an aspect, a radio frequency duplexer circuit is provided. The radio frequency duplexer circuit includes: a first terminal configured to receive an input signal; a second terminal configured to output a low frequency signal; a third terminal configured to output a high frequency signal; a low-pass filter coupled between the first terminal and the second terminal; and a high-pass filter coupled between the first terminal and the third terminal. The low-pass filter includes N first filter sub-circuits coupled in series and a first tuning sub-circuit coupled to at least a portion of the N first filter sub-circuits, each of the N first filter sub-circuits includes a first end and a second end, and the second end of the first filter sub-circuit is coupled to the first tuning sub-circuit; among the N first filter sub-circuits coupled in series, a first end of a $1^{st}$ first filter sub-circuit is coupled to the first terminal, and a second end of a $N^{th}$ first filter sub-circuit is coupled to the second terminal; N is an integer greater than or equal to 1; each of the N first filter sub-circuits is configured to filter out a high frequency signal; and the first tuning sub-circuit is configured to pass a high frequency signal therethrough; the high-pass filter includes M second filter sub-circuits coupled in series and a second tuning sub-circuit coupled to at least a portion of the M second filter sub-circuits; each of the M second filter sub-circuits includes a first end and a second end, and the second end of the second filter sub-circuit is coupled to the second tuning sub-circuit; among the M second filter sub-circuits coupled in series, a first end of a $1^{st}$ second filter sub-circuit is coupled to the first terminal, and a second end of a $M^{th}$ second filter sub-circuit is coupled to the third terminal; M is an integer greater than or equal to 1; each of the M second filter sub-circuits is configured to filter out a low frequency signal; the second tuning sub-circuit is configured to pass a low frequency signal therethrough.

In an embodiment, each of the N first filter sub-circuits coupled in series includes a first inductor and a first capacitor coupled in series; the first inductors and the first capacitors of the N first filter sub-circuits coupled in series are sequentially coupled in series, a first end of a first inductor of the $1^{st}$ first filter sub-circuit is coupled to the first terminal, and a first capacitor of the $N^{th}$ first filter sub-circuit is coupled to the second terminal.

In an embodiment, a first end of a first inductor of an $i^{th}$ one of the N first filter sub-circuits coupled in series is coupled to a second end of a first capacitor of an $(i-1)^{th}$ first filter sub-circuit, a second end of a first capacitor of the $i^{th}$ first filter sub-circuit is coupled to a first end of a first inductor of an $(i+1)^{th}$ first filter sub-circuit, i<N.

In an embodiment, the first tuning sub-circuit includes a second inductor and a second capacitor coupled in parallel. A first end of the second inductor is coupled to a first end of the second capacitor, and the first end of the second inductor and the first end of the second capacitor are coupled between two directly adjacent first filter sub-circuits, and a second end of the second inductor is coupled to a second end of the second capacitor, and the second end of the second inductor and the second end of the second capacitor are coupled to a grounding terminal.

In an embodiment, the first end of the second inductor and the first end of the second capacitor are directly and commonly coupled to the first end of the first inductor of the $i^{th}$ first filter sub-circuit and the second end of the first capacitor of the $(i-1)^{th}$ first filter sub-circuit of the N first filter sub-circuits coupled in series.

In an embodiment, each of the M second filter sub-circuits coupled in series includes a third inductor and a third capacitor coupled in series; and the third inductors and the third capacitors of M the second filter sub-circuits coupled in series are sequentially coupled in series, a first end of a third inductor of a $1^{st}$ second filter sub-circuit is coupled to the first terminal, and a third capacitor of a $M^{th}$ second filter sub-circuit is coupled to the third terminal.

In an embodiment, a first end of a third inductor of an $i^{th}$ second filter sub-circuit of the M second filter sub-circuits coupled in series is coupled to a second end of a third capacitor of an $(i-1)^{th}$ second filter sub-circuit, and a second end of a third capacitor of the $i^{th}$ second filter sub-circuit is coupled to a first end of a third inductor of an $(i+1)^{th}$ second filter sub-circuit, i<M.

In an embodiment, the second tuning sub-circuit includes a fourth inductor and a fourth capacitor coupled in parallel, a first end of the fourth inductor is coupled to a first end of the fourth capacitor, and the first end of the fourth inductor and the first end of the fourth capacitor are coupled between two directly adjacent second filter sub-circuits, and a second end of the fourth inductor is coupled to a second end of the fourth capacitor, and the second end of the fourth inductor and the second end of the fourth capacitor are coupled to a grounding terminal.

In an embodiment, the first end of the fourth inductor and the first end of the fourth capacitor are directly and commonly coupled to the first end of the third inductor of the $i^{th}$ second filter sub-circuit and the second end of the third capacitor of the $(i-1)^{th}$ second filter sub-circuit of the M second filter sub-circuits coupled in series.

In an embodiment, the radio frequency duplexer circuit includes a plurality of first tuning sub-circuits and a plurality of second tuning sub-circuits. One f the first tuning sub-circuits is coupled between any two directly adjacent first filter sub-circuits, and one of the second tuning sub-circuits is coupled between any two directly adjacent second filter sub-circuits.

In an embodiment, each of the first terminal, second terminal and third terminal is a 50Ω matched terminal.

In an embodiment, M is equal to N.

In an embodiment, the low-pass filter has a frequency band in a range from 680 MHz to 980 MHz.

In an embodiment, the high-pass filter has a frequency band in a range from 1600 MHz to 2750 MHz.

As another aspect, a radio frequency substrate is provided. The radio frequency substrate includes a base substrate, and the radio frequency duplexer circuit describe above located on the base substrate.

In an embodiment, the base substrate includes a glass substrate.

As yet another aspect, a radio frequency duplexer circuit is provided. The radio frequency duplexer circuit includes: a first terminal configured to receive an input signal; a second terminal configured to output a low frequency signal; a third terminal configured to output a high frequency signal; a low-pass filter coupled between the first terminal and the second terminal, a high-pass filter coupled between the first terminal and the third terminal. The low-pass filter includes N first filter sub-circuits coupled in series and a first tuning sub-circuit coupled to at least a portion of the N first filter sub-circuits; each of the N first filter sub-circuits includes a first end and a second end, and the second end of the first filter sub-circuit is coupled to the first tuning sub-circuit. Among the N first filter sub-circuits coupled in series, a first end of a $1^{st}$ first filter sub-circuit is coupled to the first terminal, and a second end of a $N^{th}$ first filter sub-circuit is coupled to the second terminal; N is an integer greater than or equal to 1; each of the first filter sub-circuits is configured to filter out a high frequency signal; the first tuning sub-circuit is configured to pass a high frequency signal therethrough. The high-pass filter includes M second filter sub-circuits coupled in series and a second tuning sub-circuit coupled to at least a portion of the M second filter sub-circuits; each of the M second filter sub-circuits includes a first end and a second end, and the second end of the second filter sub-circuit is coupled to the second tuning sub-circuit. Among the M second filter sub-circuits coupled in series, a first end of a $1^{st}$ second filter sub-circuit is coupled to the first terminal, and a second end of a $M^{th}$ second filter sub-circuit is coupled to the third terminal; M is an integer greater than or equal to 1; each of the second filter sub-circuits is configured to filter out a low frequency signal, and the second tuning sub-circuit is configured to pass a low frequency signal therethrough. Each of the N first filter sub-circuits coupled in series includes a first inductor and a first capacitor coupled in series; the first inductors and the first capacitors of the N first filter sub-circuits coupled in series are sequentially coupled in series, a first end of a first inductor of the $1^{st}$ first filter sub-circuit is coupled to the first terminal, a first capacitor of the $N^{th}$ filter sub-circuit is coupled to the second terminal. The first tuning sub-circuit includes a second inductor and a second capacitor coupled in parallel; a first end of the second inductor is coupled to a first end of the second capacitor, and the first end of the second inductor and the first end of the second capacitor are coupled between two directly adjacent first filter sub-circuits; a second end of the second inductor is coupled to a second end of the second capacitor, and the second end of the second inductor and the second end of the second capacitor are coupled to a grounding terminal. Each of the M second filter sub-circuits coupled in series includes a third inductor and a third capacitor coupled in series; the third inductors and the third capacitors of the M second filter sub-circuits coupled in series are sequentially coupled in series, a first end of a third inductor of a $1^{st}$ second filter sub-circuit is coupled to the first terminal, a third capacitor of a $M^{th}$ second filter sub-circuit is coupled to the third terminal. The second tuning sub-circuit includes a fourth inductor and a fourth capacitor coupled in parallel; a first end of the fourth inductor is coupled to a first end of the fourth capacitor, and the first end of the fourth inductor and the first end of the fourth capacitor are coupled between two directly adjacent second filter sub-circuits; and a second end of the fourth inductor is coupled to a second end of the fourth capacitor and the second end of the fourth inductor and the second end of the fourth capacitor are coupled to a grounding terminal.

DETAILED DESCRIPTION

In order to make one of ordinary skill in the art understand the technical solutions of the present invention better, the present invention will be further described in detail with reference to the accompanying drawings and the detailed description below.

The radio frequency duplexer circuit includes a first terminal, a second terminal and a third terminal. The first terminal is an antenna terminal. When the antenna terminal serves as a receiving terminal, the second terminal is an output terminal for outputting a low-frequency signal, and the third terminal is an output terminal for outputting a high-frequency signal. When the antenna terminal serves as a transmitting terminal, the second terminal serves as an input terminal to which a low-frequency signal is input, and the third terminal serves as an input terminal to which a high-frequency signal is input. In the following description, for convenience of understanding and description, an embodiment, in which the first terminal serves as a receiving terminal, the second terminal serves as an output terminal for outputting a low-frequency signal, and the third terminal serves as an output terminal for outputting a high-frequency signal, will be described as an example. A low-pass filter has a frequency band in a range from 680 MHz to 980 MHz, and a high-pass filter has a frequency band in a range from 1600 MHz to 2750 MHz.

Figure 1:
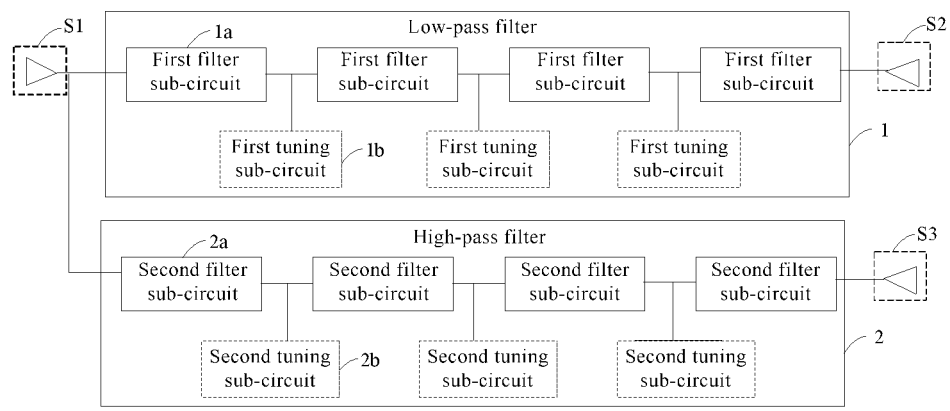
FIG. 1 is a schematic diagram showing a radio frequency (RF) duplexer circuit according to an embodiment of the present disclosure.

FIG. 1 is a schematic diagram showing a radio frequency duplexer circuit according to an embodiment of the present disclosure. As shown in FIG. 1, an embodiment of the present disclosure provides a radio frequency duplexer circuit, which includes a first terminal S1, a second terminal S2, a third terminal S3, a low-pass filter 1, and a high-pass filter 2. The low-pass filter 1 is coupled between the first terminal S1 and the second terminal S2, and configured to filter out a high frequency signal from a microwave signal received by the first terminal S1 and output the filtered signal through the second terminal S2. The high-pass filter 2 is coupled between the first terminal S1 and the third terminal S3, and is configured to filter out a low frequency signal from the microwave signal received by the first terminal S1, and output the filtered signal through the third terminal S3.

With continued reference to FIG. 1, the low-pass filter 1 in the embodiment of the present disclosure includes N first filter sub-circuits 1a coupled in series (each of the first filter sub-circuits 1a has a first end and a second end), and a first tuning sub-circuit 1b coupled to the second ends of at least a portion of the first filter sub-circuits 1a. Among the N first filter sub-circuits 1a coupled in series, the first end of the $1^{st}$ first filter sub-circuit 1a is coupled to the first terminal S1, and the second end of the $N^{th}$ first filter sub-circuit 1a is coupled to the second terminal S2; N is an integer more than or equal to 1. Each of the first filter sub-circuits 1a is configured to prevent a high-frequency signal from passing through; the first tuning sub-circuit 1b is configured to allow a high frequency signal to pass through. In FIG. 1, an embodiment, in which N=4, and one first tuning sub-circuit 1b is coupled between two adjacent first filter sub-circuits 1a, will be described as an example. That is, the low-pass filter 1 includes four first filter sub-circuits 1a and three first tuning sub-circuits 1b. It should be understood that, in the embodiment of the present disclosure, the number of the first filter sub-circuits 1a and the number of the first tuning sub-circuits 1b in the low-pass filter 1 are not limited thereto, and the number of the first filter sub-circuits 1a and the number of the first tuning sub-circuits 1b may be designed as needed. The high-pass filter 2 includes M second filter sub-circuits 2a coupled in series (each of the second filter sub-circuits 2a has a first end and a second end), and second tuning sub-circuits 2b coupled to the second ends of at least a portion of the second filter sub-circuits 2a. Among the M second filter sub-circuits 2a coupled in series, the first end of the $1^{st}$ second filter sub-circuit 2a is coupled to the first terminal S1, and the second end of the $M^{th}$ second filter sub-circuit 2a is coupled to the third terminal S3; M is an integer more than or equal to 1. Each of the second filter sub-circuits 2a is configured to prevent a low-frequency signal from passing through; each of the second tuning sub-circuits 2b is configured to allow a low frequency signal to pass through. In FIG. 1, an embodiment, in which M=N=4, and one second tuning sub-circuit 2b is coupled between two adjacent second filter sub-circuits 2a, will be described as an example. That is, the high-pass filter 2 includes four second filter sub-circuits 2a and three second tuning sub-circuits 2b. It should be understood that, in the embodiment of the present disclosure, the number of the second filter sub-circuits 2a and the number of the second tuning sub-circuits 2b in the high-pass filter 2 are not limited thereto, and the number of the second filter sub-circuits 2a and the number of the second tuning sub-circuits 2b may be designed as needed.

It should be noted here that, in the following description, an embodiment, in which the low-pass filter 1 includes four first filter sub-circuits 1a and three first tuning sub-circuits 1b and the high-pass filter 2 includes four second filter sub-circuits 2a and three second tuning sub-circuits 2b, will be described as an example.

Figure 2:
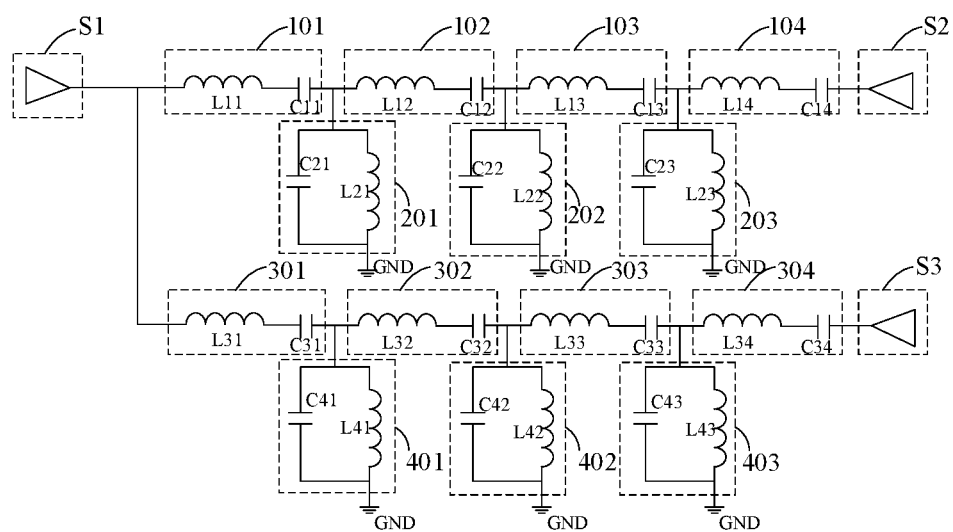
FIG. 2 is a circuit diagram showing a radio frequency duplexer circuit according to an embodiment of the present disclosure.

FIG. 2 is a circuit diagram showing a radio frequency duplexer circuit according to an embodiment of the present disclosure. As shown in FIG. 2, each of the first filter sub-circuits includes a first inductor and a first capacitor. A first end of the first inductor in each of the first filter sub-circuits serves as the first end of the first filter sub-circuit, and a second end of the first capacitor serves as the second end of the first filter sub-circuit. A second end of the first inductor in each of the first filter sub-circuits is coupled to the first end of the first capacitor. The first end of the first inductor L11 in the $1^{st}$ first filter sub-circuit 101 is coupled to the first terminal S1, and the second end of the first capacitor C11 is coupled to the first end of the first inductor L12 in the $2^{nd}$ first filter sub-circuit 102 and one of the first tuning sub-circuits 1b. The second end of the first capacitor C12 in the $2^{nd}$ first filter sub-circuit 102 is coupled to the first end of the first inductor L13 in the $3^{rd}$ first filter sub-circuit 103 and one of the first tuning sub-circuits 1b. The second end of the first capacitor C13 in the $3^{rd}$ first filter sub-circuit 103 is coupled to the first end of the first inductor L14 in the $4^{th}$ first filter sub-circuit 104 and one of the first tuning sub-circuits 1b. The second end of the first capacitor C14 in the $4^{th}$ first filter sub-circuit 104 is coupled to the second terminal S2.

The first end of the first inductor L12 of the $i^{th}$ first filter sub-circuit 102 of the N (i.e., three) first filter sub-circuits coupled in series is coupled to the second end of the first capacitor C11 of the (i−1)th first filter sub-circuit 101, and the second end of the first capacitor C12 of the $i^{th}$ first filter sub-circuit 102 is coupled to the first end of the first inductor L13 of the $(i+1)^{th}$ first filter sub-circuit 103, i<N.

The first filter sub-circuit 1a in the embodiment of the present disclosure includes the first inductor and the first capacitor coupled in series. In this case, a filtering effect can be realized by setting parameter values of the first inductor and the first capacitor. Since the first filter sub-circuit 1a is configured to prevent the high frequency signal from passing through, the first inductor with a larger inductance value may be provided to prevent the high frequency signal from passing through, and the first capacitor with a smaller capacitance value may be further provided to allow the low frequency signal to pass through. That is, the first inductor with a larger inductance value can be used in conjunction with the first capacitor with a smaller capacitance value to allow the low frequency signal to pass through.

In some embodiments, with continued reference to FIG. 2, the first tuning sub-circuit 1b may include a second inductor and a second capacitor. The second inductor is coupled to the second capacitor in parallel. The first end of the second inductor is coupled to the first end of the second capacitor, and both of the first end of the second inductor and the first end of the second capacitor are coupled to two adjacent first filter sub-circuits; the second end of the second inductor is coupled to the second end of the second capacitor, and the second end of the second inductor and the second end of the second capacitor are coupled to the ground GND.

The first end of the second inductor C21 and the first end of the second capacitor L21 are directly and commonly coupled to the first end of the first inductor L12 of the $i^{th}$ first filter sub-circuit 102 and the second end of the first capacitor C11 of the $(i-1)^{th}$ first filter sub-circuit 101 of the N first filter sub-circuits coupled in series.

For example, when the first filter sub-circuit includes the first inductor and the first capacitor coupled in series, the first end of the second inductor L21 and the first end of the second capacitor C21 of the $1^{st}$ first tuning sub-circuit 201 are coupled to each other, and coupled to the second end of the first capacitor C11 of the $1^{st}$ first filter sub-circuit 101 and the first end of the first inductor L12 of the $2^{nd}$ first filter sub-circuit 102. The first end of the second inductor L22 and the first end of the second capacitor C22 of the $2^{nd}$ first tuning sub-circuit 202 are coupled to each other, and coupled to the second end of the first capacitor C12 of the $2^{nd}$ first filter sub-circuit 102 and the first end of the first inductor L13 of the $3^{rd}$ first filter sub-circuit 103. The first end of the second inductor L23 and the first end of the second capacitor C23 of the $3^{rd}$ first tuning sub-circuit 203 are coupled to each other, and coupled to the second end of the first capacitor C13 of the $3^{rd}$ first filter sub-circuit 103 and the first end of the first inductor L14 of the $4^{th}$ first filter sub-circuit 104.

In this case, a resonant frequency may be selected as a suppression point by setting the parameter values of the second inductor and the second capacitor of the first tuning sub-circuit 1b, so as to avoid blocking of the high frequency signal. Specifically, a resonant frequency of the first tuning sub-circuit is selected according to a fundamental frequency of the low-pass filter 1. The fundamental frequency may be a middle frequency in the frequency band of the low-pass filter 1. For example, the low-pass filter 1 has a frequency band in a range from 680 MHz to 980 MHz, and the middle frequency of the frequency band of 680 MHz to 980 MHz may be selected as the fundamental frequency. The resonant frequency of the first tuning sub-circuit is set according to the fundamental frequency, and a magnitude of the resonant frequency depends on the values of the second inductor and the second capacitor. In some embodiments, a larger capacitor (a capacitor with a larger capacitance value) and a smaller inductor (an inductor with a smaller inductance value) may be selected to allow the high frequency signal to pass. As can be seen from FIG. 2, the low-pass filter 1 outputs a stable low frequency signal through the second terminal S2 after seven times of filtering.

In some embodiments, each second filter sub-circuit includes a third inductor and a third capacitor. A first end of the third inductor in each of the second filter sub-circuits serves as the first end of the second filter sub-circuit, and a second end of the third capacitor serves as the second end of the second filter sub-circuit. A second end of the third inductor in each of the second filter sub-circuits is coupled to the first end of the third capacitor; the first end of the third inductor L31 in the $1^{st}$ second filter sub-circuit 301 is coupled to the first terminal S1, and the second end of the third capacitor C31 is coupled to the first end of the third inductor L32 in the $2^{nd}$ second filter sub-circuit 302 and one of the second tuning sub-circuits 2b. The second end of the third capacitor C32 in the $2^{nd}$ second filter sub-circuit 302 is coupled to the first end of the third inductor L33 in the $3^{rd}$ second filter sub-circuit 303 and the one of the second tuning sub-circuits 2b. The second end of the third capacitor C33 in the $3^{rd}$ second filter sub-circuit 303 is coupled to the first end of the third inductor L34 in the $4^{th}$ second filter sub-circuit 304 and one of the second tuning sub-circuits 2b. The second end of the third capacitor C34 in the $4^{th}$ second filter sub-circuit 304 is coupled to the third terminal S3.

The first end of the third inductor L32 of the $i^{th}$ second filter sub-circuit 302 of the M (i.e., 3) second filter sub-circuits coupled in series is coupled to the second end of the third capacitor C31 of the $(i-1)^{th}$ second filter sub-circuit 301, and the second end of the third capacitor C32 of the $i^{th}$ second filter sub-circuit 302 is coupled to the first end of the third inductor L33 of the $(i+1)^{th}$ second filter sub-circuit 303, and i<M.

The second filter sub-circuit 2a in the embodiment of the present disclosure includes the third inductor and the third capacitor coupled in series. In this case, the filtering effect can be realized by setting the parameter values of the third inductor and the third capacitor. Since the second filter sub-circuit 2a is configured to prevent a low-frequency signal from passing through, a first inductor with a smaller inductance value may be provided to prevent a high-frequency signal from passing through, and a first capacitor with a smaller capacitance value may be further provided to allow a high-frequency signal to pass through, that is, the first inductor with a smaller inductance value can be used in cooperation with the first capacitor with a smaller capacitance value for selecting a high-frequency signal to pass through.

In some embodiments, with continued reference to FIG. 2, the second tuning sub-circuit 2b may include a fourth inductor and a fourth capacitor. The fourth inductor is coupled to the fourth capacitor in parallel. The first end of the fourth inductor is coupled to the first end of the fourth capacitor, and the first end of the fourth inductor and the first end of the fourth capacitor are coupled to two adjacent second filter sub-circuits 2a; and the second end of the fourth inductor is coupled to the second end of the fourth capacitor, and the second end of the fourth inductor and the second end of the fourth capacitor are coupled to the ground GND.

The first end of the fourth inductor L41 and the first end of the fourth capacitor C41 are directly and commonly coupled to the first end of the third inductor L32 of the $i^{th}$ second filter sub-circuit 302 and the second end of the third capacitor C31 of the $(i-1)^{th}$ second filter sub-circuit 301 of the M second filter sub-circuits coupled in series.

For example, when the second filter sub-circuit includes the third inductor and the third capacitor coupled in series, the first end of the fourth inductor L41 and the first end of the fourth capacitor C41 of the $1^{st}$ second tuning sub-circuit 401 are coupled to each other, and coupled to the second end of the third capacitor C31 of the $1^{st}$ second filter sub-circuit 301 and the first end of the third inductor L32 of the $2^{nd}$ second filter sub-circuit 302. The first end of the fourth inductor L42 and the first end of the fourth capacitor C42 of the $2^{nd}$ second tuning sub-circuit 402 are coupled to each other, and coupled to the second end of the third capacitor C32 of the $2^{nd}$ second filter sub-circuit 302 and the first end of the third inductor L33 of the $3^{rd}$ second filter sub-circuit 303. The first end of the fourth inductor L43 and the first end of the fourth capacitor C43 of the $3^{rd}$ second tuning sub-circuit 403 are coupled to each other, and coupled to the second end of the third capacitor C33 of the $3^{rd}$ second filter sub-circuit 303 and the first end of the third inductor L34 of the $4^{th}$ second filter sub-circuit 304.

In this case, one resonant frequency can be selected as a suppression point by setting the parameter values of the fourth inductor and the fourth capacitor in the second tuning sub-circuit 2b so as to avoid the blocking of the low frequency signal. Specifically, the resonant frequency of the second tuning sub-circuit 2b is selected according to the fundamental frequency of the high-pass filter 2. The fundamental frequency may be the middle frequency of the frequency band of the high-pass filter 2. For example, the frequency band of the high-pass filter 2 is in a range from 1600 MHz to 2750 MHz, and the central frequency band of 1600 MHz to 2750 MHz is selected as the fundamental frequency. The resonant frequency of the second tuning sub-circuit 2b is set according to the fundamental frequency, and the magnitude of the resonant frequency depends on the values of the fourth inductor and the fourth capacitor. In some embodiments, the low frequency signal may be allowed to pass by selecting a larger capacitor and smaller inductor. Thus, as can be seen from FIG. 2, the high-pass filter 2 outputs a stable high frequency signal through the second terminal S2 by seven times of filtering.

In some embodiments, the first terminal S1, the second terminal S2, and the third terminal S3 are all 50Ω matched terminals. Considering the process deviation in the actual process, there may be a certain error between the matching impedances of the terminals, which is within the protection scope of the embodiments of the present disclosure.

In order to make the radio frequency duplexer circuit in the embodiment of the present disclosure clearer, the following description will be made with reference to specific embodiments. The low-frequency filter of the radio-frequency duplexer circuit includes four first filter sub-circuits 1a and three first tuning sub-circuits 1b. The high-frequency filter of the radio-frequency diplexer circuit includes four second filter sub-circuits 2a and three second tuning sub-circuits 2b. Each of the first filter sub-circuits 1a includes a first inductor and a first capacitor which are coupled in series; each of the first tuning sub-circuits 1b includes a second inductor and a second capacitor coupled in parallel; each of the second filter sub-circuits 2a includes a third inductor and a third capacitor which are coupled in series; each of the second tuning sub-circuits 2b includes a fourth inductor and a fourth capacitor coupled in parallel.

With continued reference to FIG. 2; in the low frequency filter, the second end of the first inductor in each of the first filter sub-circuits 1a is coupled to the first end of the first capacitor; in the $1^{st}$ first filter sub-circuit 101, the first end of the first inductor L11 is coupled to the first terminal S1, the second end of the first capacitor C11 is coupled to the first end of the first inductor L12 in the $2^{nd}$ first filter sub-circuit 102, and coupled to the first end of the second inductor L21 and the first end of the second capacitor C21 of the $1^{st}$ first tuning sub-circuit 201. The second end of the first capacitor C12 in the $2^{nd}$ first filter sub-circuit 102 is coupled to the first end of the first inductor L13 in the $3^{rd}$ first filter sub-circuit 103 and the first end of the second inductor L22 and the first end of the second capacitor C22 of the $2^{nd}$ first tuning sub-circuit 202. The second end of the first capacitor C13 in the $3^{rd}$ first filter sub-circuit 103 is coupled to the first end of the first inductor L14 in the $4^{th}$ first filter sub-circuit 104, and coupled to the first end of the second inductor L23 and the first end of the second capacitor C23 of the $3^{rd}$ first tuning sub-circuit 203. The second end of the first capacitor C14 in the $4^{th}$ first filter sub-circuit 104 is coupled to the second terminal S2. The second end of the second inductor and the second end of the second capacitor in each of the first tuning sub-circuits 1b are both coupled to the ground GND.

In the high-frequency filter, the second end of the third inductor in each of the second filter sub-circuits 2a is coupled to the first end of the third capacitor. In the $1^{st}$ second filter sub-circuit 301, the first end of the third inductor L31 is coupled to the first terminal S1, and the second end of the third capacitor C31 is coupled to the first end of the third inductor L32 in the $2^{nd}$ second filter sub-circuit 302, and coupled to the first end of the fourth inductor L41 and the first end of the fourth capacitor C41 of the $1^{st}$ second tuning sub-circuit 401. The second end of the third capacitor C32 in the $2^{nd}$ second filter sub-circuit 302 is coupled to the first end of the third inductor L33 in the $3^{rd}$ second filter sub-circuit 303, and coupled to the first end of the fourth inductor L42 and the first end of the fourth capacitor C42 of the $2^{nd}$ second tuning sub-circuit 402. The second end of the third capacitor C33 in the $3^{rd}$ second filter sub-circuit 303 is coupled to the first end of the third inductor L34 in the $4^{th}$ second filter sub-circuit 304, and coupled to the first end of the fourth inductor L43 and the first end of the fourth capacitor C43 in the $3^{rd}$ second tuning sub-circuit 403. The second end of the third capacitor C34 in the $4^{th}$ second filter sub-circuit 304 is coupled to the third terminal S3. The second end of the fourth inductor and the second end of the fourth capacitor of each of the second tuning sub-circuits 2b are both coupled to the ground GND.

The first terminal S1, the second terminal S2, and the third terminal S3 all employ 50Ω matched terminals. Wherein L11=39.1 Nh, C11=0.97 pF; L12=47.7 nH, C12=0.80 pF; L13=43.1 nH, C5=0.88 pF; L14=15.7 nH, C14=2.43 pF; L21=2.1 nH, C21=18.46 pF; L22=2.1 nH, C22=18.15 pF; L23=2.8 nH, C23=13.70 pF. L31=10.2 nH, C31=0.56 pF; L32=12.4 nH, C32=0.46 pF; L33=11.2 nH, C33=0.51 pF; L34=4.1 nH, C34=1.41 pF; L41=1.2 nH, C41=4.81 pF; L42=1.2 nH, C42=4.73 pF; L43=1.6 nH, C43=3.57 pF.

As a second aspect, an embodiment of the present disclosure provides a radio frequency substrate, which includes a base substrate, and a radio frequency duplexer circuit disposed on the base substrate. The radio frequency duplexer circuit is any one of the radio frequency duplexer circuits described above. The base substrate includes, but is not limited to, a glass substrate.

In the embodiment of the present disclosure, the radio frequency duplexer circuit has passive devices such as inductors, capacitors, resistors, and the like, and the glass base substrate on which these devices are integrated has advantages such as a small volume, a light weight, a high performance, a low power consumption, and the like. It should be noted that, in the embodiment of the present disclosure, the base substrate may further adopt any one of a flexible substrate and an interlayer dielectric layer including at least an organic insulating layer.

In order to make the structures of the layers of the radio frequency substrate more clear in the embodiment of the present disclosure, as an example, the first terminal S1, the second terminal S2, and the third terminal S3 are all 50Ω matched terminals; the first filter sub-circuit includes a first inductor and a first capacitor; the first tuning sub-circuit includes a second inductor and a second capacitor; the second filter sub-circuit includes a third inductor and a third capacitor, and the second tuning sub-circuit includes a fourth inductor and a fourth capacitor. In some embodiments, the first inductor, the second inductor, the third inductor, and the fourth inductor may have the same structure, and the first capacitor, the second capacitor, and the third capacitor has the same structure. Therefore, for convenience of describing, one inductor, one capacitor and one resistor are provided as a representative for illustrating the structures of the layers of the radio frequency substrate.

Figure 3:
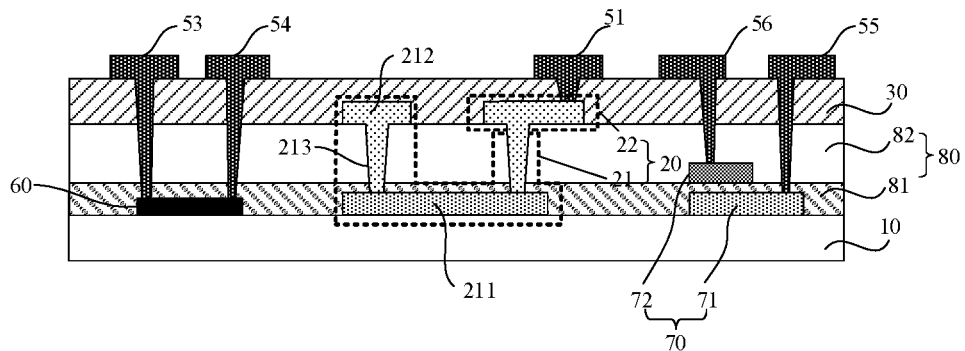
FIG. 3 is a cross-sectional view showing an RF substrate according to an embodiment of the present disclosure.
Figure 4:
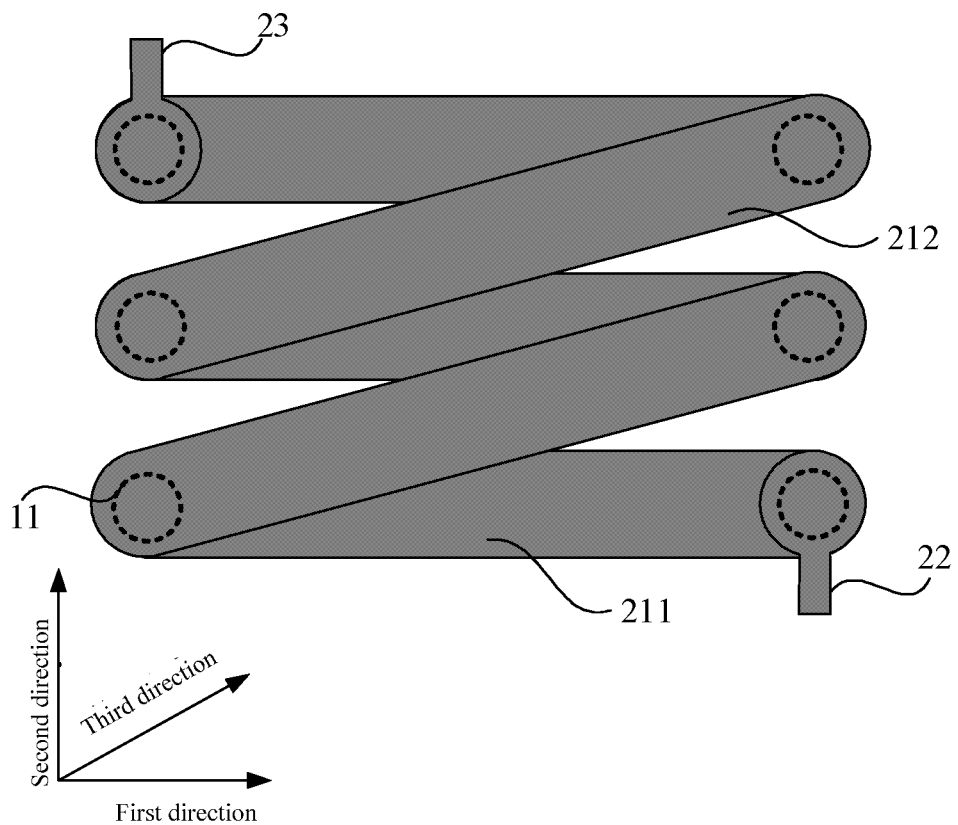
FIG. 4 is a top view showing an inductor according to an embodiment of the present disclosure.

FIG. 3 is a cross-sectional view showing a radio frequency substrate according to an embodiment of the present disclosure; and FIG. 4 is a top view showing an inductor according to an embodiment of the present disclosure. As shown in FIG. 3 and FIG. 4, the radio frequency substrate includes a base substrate which may be a glass substrate. An inductor 20, a capacitor 70 and a resistor 60 are disposed on the radio frequency substrate. The inductor generally includes an inductor coil and a first lead terminal 22 and a second lead terminal 23 coupled to a first signal terminal and a second signal terminal of the inductor coil, respectively. In the embodiment of the present disclosure, the inductor coil at least includes first sub-structures 211 and second sub-structures 212. The first sub-structures 211 and the second sub-structures 212 are respectively disposed on two opposite sides of a first interlayer dielectric layer 80, and one of the second sub-structures 212 is short circuited with or connected to a first sub-structure 211 adjacent to the second sub-structure 212 through a first through hole 11 penetrating through the first interlayer dielectric layer so as to form the inductor coil of the inductor.

As shown in FIG. 4, the first sub-structures 211 of the inductor 20 extend along a first direction and are arranged side by side along a second direction. The second sub-structures 212 of the inductor 20 extend along a third direction and are arranged side by side along the second direction. The first direction, the second direction and the third direction are different directions. In the embodiment of the present disclosure, the first direction and the second direction are perpendicular to each other, and the first direction and the third direction are intersected and non-perpendicular to each other. Of course, the extending directions of the first sub-structures 211 and the second sub-structures 212 may be interchanged, all of which are within the protection scope of the embodiments of the present disclosure. In addition, in the embodiment, the inductor 20 includes K first sub-structures 211 and (K−1) second sub-structures, where K≥2 and K is an integer. The first end and the second end of the first sub-structure 211 at least partially overlap orthographic projections of two first through holes 11 on the glass substrate 10, respectively. The first end and the second end of one first sub-structure 211 correspond to different first through holes 11, that is, one of the first sub-structures 211 at least partially overlaps the orthographic projections of two corresponding first through holes 11 on the glass substrate 10. At this time, the first end of the $i^{th}$ second sub-structure 212 of the inductor 20 is coupled to the first end of the $i^{th}$ first sub-structure 211, and the second end of the $i^{th}$ second sub-structure 212 is coupled to the second end of the $(i+1)^{th}$ first sub-structure 211 to form the inductor coil 21, where i is an integer greater than or equal to 1 and less than or equal to K−1.

As shown in FIG. 3, a first inorganic insulating layer 81 and a first organic insulating layer 82 are sequentially disposed in a direction away from the base substrate 10, and the first through hole 11 penetrates through the first inorganic insulating layer 81 and the first organic insulating layer 82. In some embodiments, the first inorganic insulating layer 81 is an inorganic insulating layer formed of silicon nitride (SiNx) or silicon oxide ($SiO_2$), or the first inorganic insulating layer 81 is a stacked film layer including an inorganic insulating layer formed of silicon nitride (SiNx) and an inorganic insulating layer formed of $SiO_2$. The first organic insulating layer 82 includes photoresist or polyimide, etc. For example, when the second interlayer dielectric layer 80 has a stacked structure including the first inorganic insulating layer 81 and the first organic insulating layer 82, the first through hole 11 may be formed by stacking a first sub-through hole penetrating the first inorganic insulating layer 81 and a second sub-through hole penetrating the first organic insulating layer 82.

In some embodiments, a connection portion 213 is formed in the first through hole 11, and the connection portion 213 may electrically couple the first sub-structure 211 to the second sub-structure 212 corresponding to the first sub-structure 211. The connection portion 213 may be formed on an inner wall of the first through hole 11, or may fill the entire of the first through hole 11, as long as it is ensured that the first sub-structure 211 can be electrically coupled to a second sub-structure 212 corresponding to the first sub-structure 211.

With continued reference to FIG. 3, a first interlayer dielectric layer 30 is disposed on a side of the second sub-structure 212 of the inductor 20 distal to the glass substrate 10, and a first pad 51 and a third pad 53 are disposed on a side of the first interlayer dielectric layer 30 distal to the glass substrate 10. A second through hole 12 and a third through hole are disposed in the first interlayer dielectric layer. The first pad 51 is electrically coupled to the first signal terminal of the inductor coil 21 through the second through hole 12, and the third pad 53 is electrically coupled to the second signal terminal of the inductor coil 21 through the third through hole. The first pad 51 and the third pad 53 are configured to electrically couple the inductor 20 to a radio frequency circuit. For example, the inductor 20 is bonded to a printed circuit board (PCB) through the first pad 51 and the third pad 53, or electrically coupled to the PCB by soldering.

For example, when the inductor 20 has the first lead terminal 22 and the second lead terminal 23, the first pad may be coupled to the second end of the $1^{st}$ first sub-structure 211 through the first lead terminal 22 to electrically couple the first pad 51 to the first signal terminal of the inductor coil 21. The third pad 53 may be coupled to the first end of the kth first sub-structure 211 through the second lead terminal 23 to electrically couple the third pad 53 to the second signal terminal of the inductor coil 21.

In some embodiments, with continued reference to FIG. 3, the substrate has not only the inductor 20 therein, but also has other devices such as the resistor 60, the capacitor 70 therein. In some embodiments, when the first interlayer dielectric layer 80 includes the first inorganic insulating layer 81 and the first organic insulating layer 82, the resistor 60 may be disposed between the glass substrate 10 and the first inorganic insulating layer 81, and the resistor 60 may include a high-resistance material, for example, tin oxide (ITO), nickel chromium (NiCr) alloy. In some embodiments, the first plate 71 of the capacitor 70 may be disposed in the same layer as the first sub-structure 211 of the inductor 20, that is, a first plate 71 of the capacitor 70 may be disposed between the glass substrate 10 and the first inorganic insulating layer 81, which is beneficial to manufacturing without complicating process steps. A second plate 72 of the capacitor 70 may be disposed between the first organic insulating layer 82 and the first inorganic insulating layer 81.

In the embodiment of the present disclosure, a fourth pad 54, a fifth pad 55, and a sixth pad 56 may be disposed in the same layer as the first pad 51 and the third pad 53. The third pad is coupled to the first end of the resistor 60 through a fourth through hole penetrating through the second interlayer dielectric layer 30 and the first interlayer dielectric layer 80 (the first interlayer dielectric layer 80 includes the first organic insulating layer 82 and the first inorganic insulating layer 81). The fourth pad 54 is coupled to the second end of the resistor 60 through a fifth through hole penetrating through the second interlayer dielectric layer 30 and the first interlayer dielectric layer 80 (the first interlayer dielectric layer 80 includes the first organic insulating layer 82 and the first inorganic insulating layer 81). The fifth pad 55 is coupled to the first plate 71 of the capacitor 70 through a sixth through hole penetrating through the second interlayer dielectric layer 30 and the first interlayer dielectric layer 80 (the first interlayer dielectric layer 80 includes the first organic insulating layer 82 and the first inorganic insulating layer 81). The sixth pad 56 is coupled to the second plate 72 of the capacitor 70 through a sixth through hole penetrating through the second interlayer dielectric layer 30 and the first organic insulating layer 82. The third pad 53 and fourth pad 54 may couple the resistor 60 to the radio frequency circuit, and the fifth pad 55 and the sixth pad 56 may couple the capacitor 70 to the radio frequency circuit. It should be understood that the capacitor 70 and the resistor 60 may be electrically coupled to the devices on the substrate without the pads.

It should be understood that the above implementations are merely exemplary embodiments for the purpose of illustrating the principles of the present disclosure, however, the present disclosure is not limited thereto. It will be apparent to one of ordinary skill in the art that various changes and modifications can be made without departing from the spirit and spirit of the present disclosure, which are also to be regarded as the scope of the present disclosure.

What is claimed is:

1. A radio frequency duplexer circuit, comprising:
a first terminal configured to receive an input signal;
a second terminal configured to output a low frequency signal;
a third terminal configured to output a high frequency signal;
a first band-pass filter coupled between the first terminal and the second terminal; and
a second band-pass filter coupled between the first terminal and the third terminal, wherein
the first band-pass filter comprises N first filter sub-circuits coupled in series and a first tuning sub-circuit coupled to at least a portion of the N first filter sub-circuits, each of the N first filter sub-circuits comprises a first end and a second end, and the second end of a $1^{st}$ first filter sub-circuit is coupled to the first tuning sub-circuit;
among the N first filter sub-circuits coupled in series, a first end of the $1^{st}$ first filter sub-circuit is coupled to the first terminal, and a second end of a Nth first filter sub-circuit is coupled to the second terminal; N is an integer greater than or equal to 1; each of the N first filter sub-circuits is configured to filter out a high frequency signal; and the first tuning sub-circuit is configured to pass a high frequency signal therethrough;
the second band-pass filter comprises M second filter sub-circuits coupled in series and a second tuning sub-circuit coupled to at least a portion of the M second filter sub-circuits; each of the M second filter sub-circuits comprises a first end and a second end, and the second end of a $1^{st}$ second filter sub-circuit is coupled to the second tuning sub-circuit;
among the M second filter sub-circuits coupled in series, a first end of the $1^{st}$ second filter sub-circuit is coupled to the first terminal, and a second end of a Mth second filter sub-circuit is coupled to the third terminal; M is an integer greater than or equal to 1; each of the M second filter sub-circuits is configured to filter out a low frequency signal; the second tuning sub-circuit is configured to pass a low frequency signal therethrough, each of the N first filter sub-circuits coupled in series comprises a first inductor and a first capacitor coupled in series; the first inductors and the first capacitors of the N first filter sub-circuits coupled in series are sequentially coupled in series, a first end of a first inductor of the $1^{st}$ first filter sub-circuit is coupled to the first terminal, and a first capacitor of the $N^{th}$ first filter sub-circuit is coupled to the second terminal, wherein a first end of a first inductor of an $i^{th}$ one of the N first filter sub-circuits coupled in series is coupled to a second end of a first capacitor of an $(i-1)^{th}$ first filter sub-circuit, a second end of a first capacitor of the $i^{th}$ first filter sub-circuit is coupled to a first end of a first inductor of an $(i+1)^{th}$ first filter sub-circuit, i<N,
the first tuning sub-circuit comprises a second inductor and a second capacitor coupled in parallel; wherein
a first end of the second inductor is directly coupled to a first end of the second capacitor, and the first end of the second inductor and the first end of the second capacitor are directly coupled between two directly adjacent first filter sub-circuits, and
a second end of the second inductor is directly coupled to a second end of the second capacitor, and the second end of the second inductor and the second end of the second capacitor are directly coupled to a grounding terminal,
the first end of the second inductor and the first end of the second capacitor are directly and commonly coupled to the first end of the first inductor of the $i^{th}$ first filter sub-circuit and the second end of the first capacitor of the $(i-1)^{th}$ first filter sub-circuit of the N first filter sub-circuits coupled in series.

2. The radio frequency duplexer circuit of claim 1, wherein the first band-pass filter has a frequency band in a range from 680 MHz to 980 MHz.

3. The radio frequency duplexer circuit of claim 1, wherein the second band-pass filter has a frequency band in a range from 1600 MHz to 2750 MHz.

4. A radio frequency substrate, comprising:
a base substrate, and
the radio frequency duplexer circuit of claim 1 on the base substrate.

5. The radio frequency substrate of claim 4, wherein the base substrate comprises a glass substrate.

6. The radio frequency duplexer circuit of claim 1, wherein each of the M second filter sub-circuits coupled in series comprises a third inductor and a third capacitor coupled in series; and the third inductors and the third capacitors of the M second filter sub-circuits coupled in series are sequentially coupled in series, a first end of a third inductor of the $1^{st}$ second filter sub-circuit is coupled to the first terminal, and a third capacitor of the $M^{th}$ second filter sub-circuit is coupled to the third terminal.

7. The radio frequency duplexer circuit of claim 6, wherein
a first end of a third inductor of an $i^{th}$ second filter sub-circuit of the M second filter sub-circuits coupled in series is coupled to a second end of a third capacitor of an $(i-1)^{th}$ second filter sub-circuit, and
a second end of a third capacitor of the $i^{th}$ second filter sub-circuit is coupled to a first end of a third inductor of an $(i+1)^{th}$ second filter sub-circuit, i<M.

8. The radio frequency duplexer circuit of claim 7, wherein
the second tuning sub-circuit comprises a fourth inductor and a fourth capacitor coupled in parallel, a first end of the fourth inductor is coupled to a first end of the fourth capacitor, and the first end of the fourth inductor and the first end of the fourth capacitor are coupled between two directly adjacent second filter sub-circuits, and a second end of the fourth inductor is coupled to a second end of the fourth capacitor, and the second end of the fourth inductor and the second end of the fourth capacitor are coupled to a grounding terminal.

9. The radio frequency duplexer circuit of claim 8, wherein the first end of the fourth inductor and the first end of the fourth capacitor are directly and commonly coupled to the first end of the third inductor of the $i^{th}$ second filter sub-circuit and the second end of the third capacitor of the $(i-1)^{th}$ second filter sub-circuit of the M second filter sub-circuits coupled in series.

10. The radio frequency duplexer circuit of claim 1, comprising a plurality of first tuning sub-circuits and a plurality of second tuning sub-circuits, wherein one of the first tuning sub-circuits is coupled between every two directly adjacent first filter sub-circuits, and one of the second tuning sub-circuits is coupled between every two directly adjacent second filter sub-circuits.

11. The radio frequency duplexer circuit of claim 1, wherein each of the first terminal, second terminal and third terminal is a 50Ω matched terminal.

12. The radio frequency duplexer circuit of claim 1, wherein M is equal to N.

13. A radio frequency duplexer circuit comprising:

a first terminal configured to receive an input signal;

a second terminal configured to output a low frequency signal;

a third terminal configured to output a high frequency signal;

a first band-pass filter coupled between the first terminal and the second terminal, a second band-pass filter coupled between the first terminal and the third terminal; wherein the first band-pass filter comprises N first filter sub-circuits coupled in series and a first tuning sub-circuit coupled to at least a portion of the N first filter sub-circuits; each of the N first filter sub-circuits comprises a first end and a second end, and the second end of a $1^{st}$ the first filter sub-circuit is coupled to the first tuning sub-circuit;

among the N first filter sub-circuits coupled in series, a first end of the $1^{st}$ first filter sub-circuit is coupled to the first terminal, and a second end of a Nth first filter sub-circuit is coupled to the second terminal; N is an integer greater than or equal to 1; each of the first filter sub-circuits is configured to filter out a high frequency signal; the first tuning sub-circuit is configured to pass a high frequency signal therethrough;

the second band-pass filter comprises M second filter sub-circuits coupled in series and a second tuning sub-circuit coupled to at least a portion of the M second filter sub-circuits; each of the M second filter sub-circuits comprises a first end and a second end, and the second end of a $1^{st}$ second filter sub-circuit is coupled to the second tuning sub-circuit;

among the M second filter sub-circuits coupled in series, a first end of the $1^{st}$ second filter sub-circuit is coupled to the first terminal, and a second end of a Mth second filter sub-circuit is coupled to the third terminal; M is an integer greater than or equal to 1; each of the second filter sub-circuits is configured to filter out a low frequency signal, and the second tuning sub-circuit is configured to pass a low frequency signal therethrough, each of the N first filter sub-circuits coupled in series comprises a first inductor and a first capacitor coupled in series; the first inductors and the first capacitors of the N first filter sub-circuits coupled in series are sequentially coupled in series, a first end of a first inductor of the 1st first filter sub-circuit is coupled to the first terminal, a first capacitor of the $N^{th}$ filter sub-circuit is coupled to the second terminal, the first tuning sub-circuit comprises a second inductor and a second capacitor coupled in parallel; a first end of the second inductor is coupled to a first end of the second capacitor, and the first end of the second inductor and the first end of the second capacitor are coupled between two directly adjacent first filter sub-circuits; a second end of the second inductor is coupled to a second end of the second capacitor, and the second end of the second inductor and the second end of the second capacitor are coupled to a grounding terminal, the first end of the second inductor and the first end of the second capacitor are directly and commonly coupled to the first end of the first inductor of the $i^{th}$ first filter sub-circuit and the second end of the first capacitor of the $(i-1)^{th}$ first filter sub-circuit of the N first filter sub-circuits coupled in series, each of the M second filter sub-circuits coupled in series comprises a third inductor and a third capacitor coupled in series; the third inductors and the third capacitors of the M second filter sub-circuits coupled in series are sequentially coupled in series, a first end of a third inductor of the $1^{st}$ second filter sub-circuit is coupled to the first terminal, a third capacitor of a $M^{th}$ second filter sub-circuit is coupled to the third terminal, wherein a first end of a third inductor an $i^{th}$ second filter sub-circuit of the M second filter sub-circuits coupled in series is coupled to a second end of a third capacitor of an $(i-1)^{th}$ second filter sub-circuit, and a second end of a third capacitor of the $i^{th}$ second filter sub-circuit is coupled to a first end of a third inductor of an $(i+1)^{th}$ second filter sub-circuit, i<M, the second tuning sub-circuit comprises a fourth inductor and a fourth capacitor coupled in parallel; a first end of the fourth inductor is coupled to a first end of the fourth capacitor, and the first end of the fourth inductor and the first end of the fourth capacitor are coupled between two directly adjacent second filter sub-circuits; and a second end of the fourth inductor is coupled to a second end of the fourth capacitor and the second end of the fourth inductor and the second end of the fourth capacitor are coupled to a grounding terminal, the first end of the fourth inductor and the first end of the fourth capacitor are directly and commonly coupled to the first end of the third inductor of the $i^{th}$ second filter sub-circuit and the second end of the third capacitor of the $(i-1)^{th}$ second filter sub-circuit of the M second filter sub-circuits coupled in series.

* * * * *